United States Patent
Chi et al.

(10) Patent No.: US 8,624,370 B2
(45) Date of Patent: Jan. 7, 2014

(54) INTEGRATED CIRCUIT PACKAGING SYSTEM WITH AN INTERPOSER AND METHOD OF MANUFACTURE THEREOF

(75) Inventors: HeeJo Chi, Daejeon-si (KR); NamJu Cho, Uiwang-si (KR); Taewoo Lee, Icheon-Si (KR)

(73) Assignee: Stats Chippac Ltd., Singapore (SG)

( * ) Notice: Subject to any disclaimer, the term of this patent is extended or adjusted under 35 U.S.C. 154(b) by 676 days.

(21) Appl. No.: 12/408,670

(22) Filed: Mar. 20, 2009

(65) Prior Publication Data

US 2010/0237483 A1 Sep. 23, 2010

(51) Int. Cl.
*H01L 23/06* (2006.01)
*H01L 23/538* (2006.01)
*H01L 21/56* (2006.01)

(52) U.S. Cl.
USPC ........... 257/678; 438/25; 438/51; 438/55; 438/64; 257/E21.575; 257/E21.627

(58) Field of Classification Search
None
See application file for complete search history.

(56) References Cited

U.S. PATENT DOCUMENTS

| | | | |
|---|---|---|---|
| 6,444,576 B1 | 9/2002 | Kong | |
| 6,791,195 B2 * | 9/2004 | Urushima | 257/783 |
| 6,908,785 B2 | 6/2005 | Kim | |
| 6,921,968 B2 | 7/2005 | Chung | |
| 7,026,709 B2 | 4/2006 | Tsai et al. | |
| 7,198,980 B2 | 4/2007 | Jiang et al. | |
| 7,317,256 B2 | 1/2008 | Williams et al. | |
| 7,390,700 B2 * | 6/2008 | Gerber et al. | 438/108 |
| 2001/0036711 A1 * | 11/2001 | Urushima | 438/460 |
| 2004/0145039 A1 * | 7/2004 | Shim et al. | 257/678 |
| 2005/0090050 A1 * | 4/2005 | Shim et al. | 438/200 |
| 2007/0152313 A1 * | 7/2007 | Periaman et al. | 257/686 |
| 2008/0211089 A1 * | 9/2008 | Khan et al. | 257/723 |
| 2008/0265399 A1 * | 10/2008 | Chao | 257/698 |
| 2010/0065948 A1 | 3/2010 | Bae et al. | |

\* cited by examiner

*Primary Examiner* — Julio J Maldonado
*Assistant Examiner* — Mohammad Choudhry
(74) *Attorney, Agent, or Firm* — Ishimaru & Associates LLP

(57) ABSTRACT

A method of manufacture of an integrated circuit packaging system includes: mounting a device over an integrated circuit having a through via; attaching an interposer, having an opening, and the integrated circuit with the device within the opening; and forming an encapsulation at least partially covering the integrated circuit and the interposer facing the integrated circuit.

20 Claims, 5 Drawing Sheets

INTEGRATED CIRCUIT PACKAGING SYSTEM WITH AN INTERPOSER AND METHOD OF MANUFACTURE THEREOF

TECHNICAL FIELD

The present invention relates generally to an integrated circuit packaging system, and more particularly to a system for an integrated circuit packaging system with an interposer.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). POP designs face reliability challenges and higher cost.

Thus, a need still remains for an integrated circuit packaging system providing low cost manufacturing, improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: mounting a device over an integrated circuit having a through via; attaching an interposer, having an opening, and the integrated circuit with the device within the opening; and forming an encapsulation at least partially covering the integrated circuit and the interposer facing the integrated circuit.

The present invention provides an integrated circuit packaging system, including: an integrated circuit having a through via; a device mounted over the integrated circuit having the through via; an interposer having an opening attached to the integrated circuit having the through via with the device within the opening of the interposer; and an encapsulation at least partially covering the integrated circuit and the interposer facing the integrated circuit.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
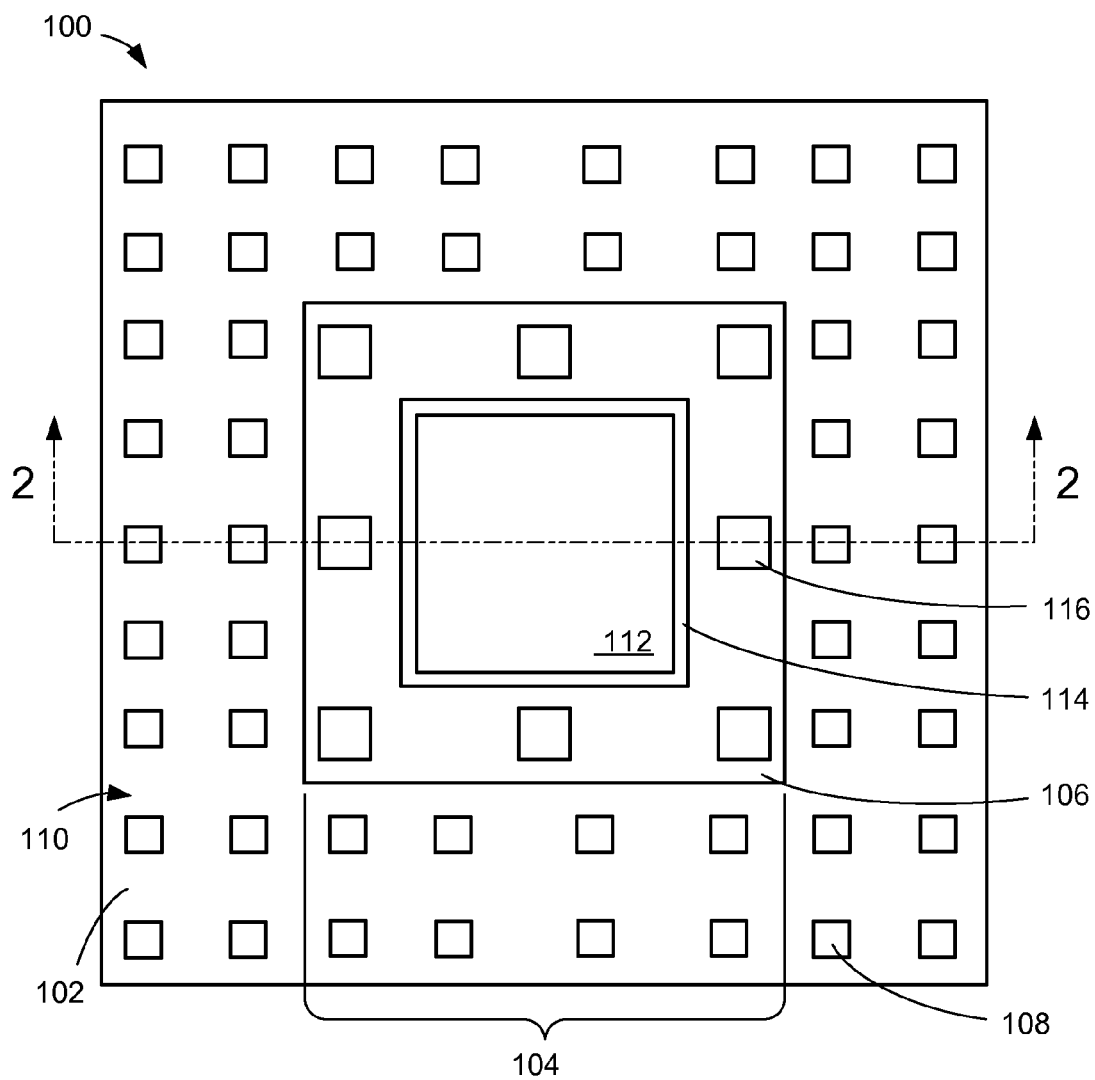
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure.

Referring now to FIG. 1, therein is shown a top view of an integrated circuit packaging system 100 in a first embodiment of the present invention. The top view depicts an interposer 102, such as a laminated substrate or a carrier, having an opening 104 mounted over a redistribution layer 106. Mounting pads 108 can be exposed from an interposer first side 110.

A device 112, such as a flip chip or packaged integrated circuit, can be mounted over the redistribution layer 106 with an underfill 114 in between. The device 112 can be within the opening 104 of the interposer 102.

For illustrative purposes, the integrated circuit packaging system 100 is shown with the device 112 mounted over the redistribution layer 106, although it is understood that the integrated circuit packaging system 100 can more than one of the device 112 mounted over the redistribution layer 106. For example, two or more of the device 112 can be mounted side by side or stacked over the redistribution layer 106 and within the opening of the interposer 102.

A component 116, such as an active component, a passive component, an inductor, a resistor, or a capacitor, can be mounted over the redistribution layer 106. The component 116 can be within the opening 104 of the interposer 102 and adjacent to the integrated circuit device 112.

For illustrative purposes, the integrated circuit packaging system 100 is shown with the component 116 mounted over the redistribution layer 106, although it is understood that the integrated circuit packaging system 100 can having a different configuration. For example, the component 116 is optional.

Figure 2:
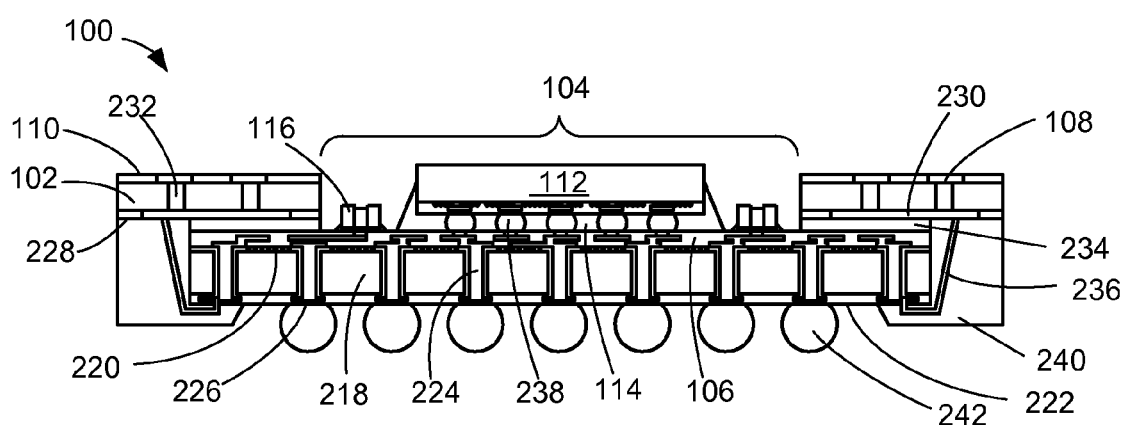
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts an integrated circuit 218, such as an integrated circuit die or a flip chip, having the redistribution layer 106. The integrated circuit 218 can have an interposer side 220 and a non-interposer side 222. The redistribution layer 106 can be over the interposer side 220 of the integrated circuit 218.

The interposer side 220 of the integrated circuit 218 can face the interposer 102. The non-interposer side 222 can face away from the interposer 102. The interposer side 220 or the non-interposer side 222 can include active circuitry (not shown) fabricated thereto.

The integrated circuit 218 can have a through via 224, such as through silicon via or conductive channel. The through via 224 can traverse between the interposer side 220 and the non-interposer side 222 of the integrated circuit 218. The through via 224 can be exposed from the interposer side 220 and can connect to the redistribution layer 106. The through via 224 can be exposed from the non-interposer side 222 to form interconnect pads 226.

The interposer 102 can have the interposer first side 110 and an interposer second side 228. A conductive pad 230 can be over the interposer second side 228.

The interposer 102 can have an interposer via 232, such as a conductive channel. The interposer via 232 can connect the interposer first side 110 and the interposer second side 228. The interposer via 232 can be exposed from the interposer first side 110 to form the mounting pads 108. The interposer via 232 can be exposed from the interposer second side 228 and can be connected to the conductive pad 230.

For illustrative purposes, the integrated circuit packaging system 100 is shown with the conductive pad 230 connecting two of the interposer via 232, although it is understood that the integrated circuit packaging system 100 can have a different configuration of the conductive pad 230 and interposer via 232. For example, the integrated circuit packaging system 100 can have less or more number of the interposer via 232. As a further example, the integrated circuit packaging system 100 can have the conductive pad 230 connecting to a different location of the interposer via 232.

An attachment structure 234, such as an adhesive film or adhesive paste, can connect the interposer second side 228 and the redistribution layer 106 of the integrated circuit 218. An internal interconnect 236, such as a bond wire or ribbon bond wire, can connect the interconnect pads 226 and the conductive pad 230.

The device 112 can be directly attached to the redistribution layer 106 with electrical connectors 238, such as solder bumps or conductive bumps. A side of the device 112 facing away from the redistribution layer 106 is above the interposer first side 110 of the interposer 102. The underfill 114 can be between the device 112 and the redistribution layer 106. The underfill 114 can surround the electrical connectors 238. The device 112 can be within the opening 104 of the interposer 102.

The component 116 can be mounted over the redistribution layer 106. The component 116 can be adjacent to the device 112 and within the opening 104 of the interposer 102. The component 116 can configure the integrated circuit 218 and the device 112. For example, the component 116 can configure a mode setting, a power setting, a filter, or can form a closed circuit connection of the redistribution layer 106.

An encapsulation 240, such as a cover including an epoxy molding compound, can cover the internal interconnect 236 partially covering the integrated circuit 218 and interposer second side 228. For example, the encapsulation 240 can cover a portion of the integrated circuit 218 with the interconnect pads 226 connected to the internal interconnect 236.

External interconnects 242, such as solder balls or conductive posts, can connect to the interconnect pads 226. The external interconnects 242 can connect to the next system level (not shown), such as a printed circuit board or another integrated circuit packaging system.

It has been discovered that the present invention provides the integrated circuit packaging system with a thinner profile. The interposer with the opening can be mounted over the integrated circuit having the through via, providing an area to mount the component device and the integrated circuit device. The through via can connect the component device and the integrated circuit device, eliminating the need for bond wires. Mounting the component and integrated circuit device within the interposer opening and eliminating the bond wires can provide an ultra thin package for numerous applications, as stacking components in a package-on-package (POP) system module.

It has also been discovered that the present invention provides the integrated circuit packaging system with improved performance during the surface mounting technology (SMT) process. The interposer can have a high coefficient of thermal expansion and the integrated circuit can have a low coefficient of thermal expansion. The interposer with the opening increases the proportion of material having a low coefficient of thermal expansion to material having a high coefficient of thermal expansion, thereby improving resistance to warping.

Figure 3:
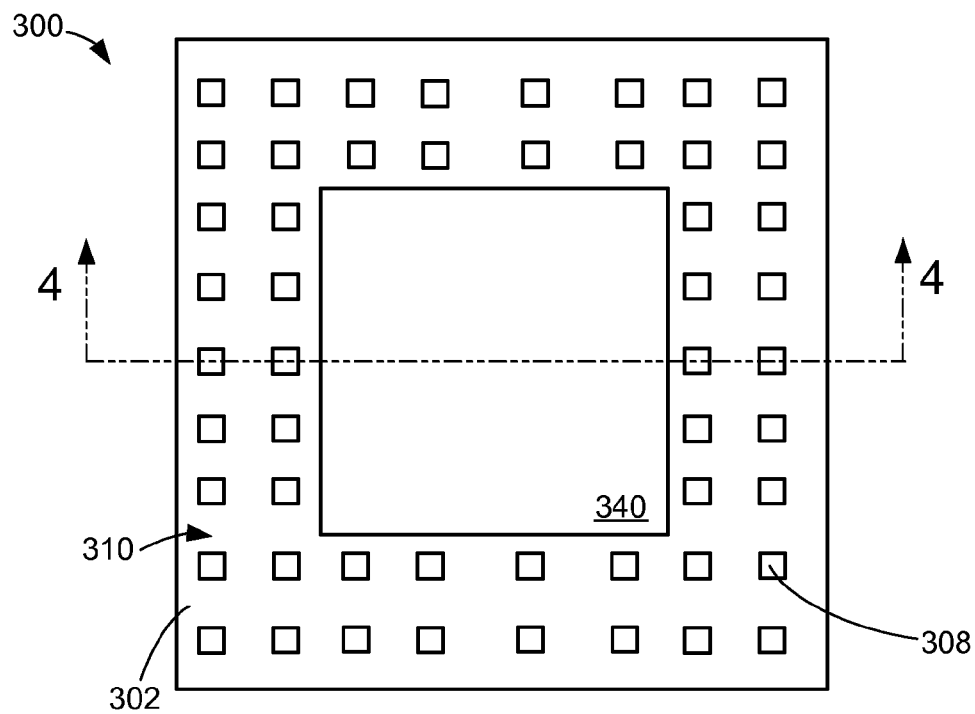
FIG. 3 is a top view of an integrated packaging system in a second embodiment of the present invention

Referring now to FIG. 3, therein is shown a top view of an integrated packaging system 300 in a second embodiment of the present invention. The top view depicts an encapsulation 340, such as a cover including an epoxy molding compound, over an interposer 302, such as a laminated substrate or a carrier. The interposer 302 can have an interposer first side 310. Mounting pads 308 can be exposed from an interposer first side 310.

For illustrative purpose, the integrated circuit packaging system 300 is shown with the encapsulation 340 having a square geometric shape and covering an interior portion of the interposer first side, although it is understood that the encapsulation 340 can have a different configuration. For example, the encapsulation 340 can have a rectangular shape extending to a peripheral portion of the interposer 302.

Figure 4:
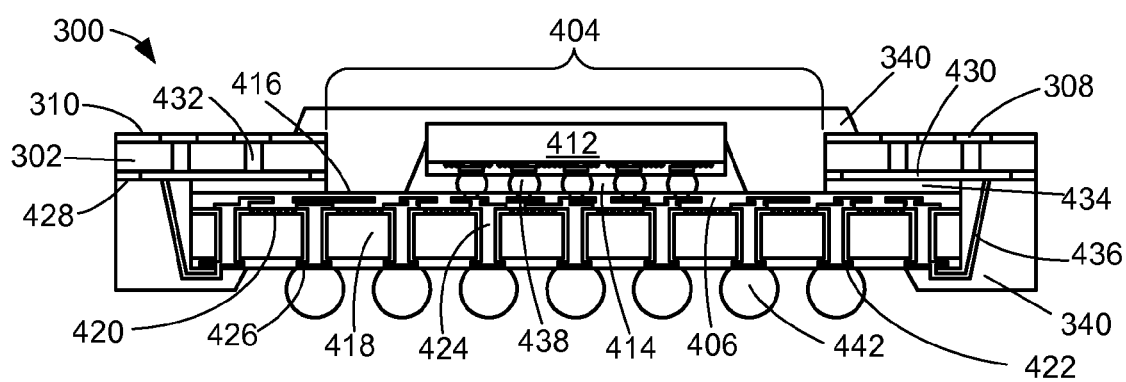
FIG. 4 is a cross-sectional view of the integrated circuit packaging system along line 4-4 of FIG. 3

Referring now to FIG. 4, therein is shown a cross-sectional view of the integrated circuit packaging system 300 along line 4-4 of FIG. 3. The cross-sectional view depicts an integrated circuit 418, such as an integrated circuit die or a flip chip, having an interposer side 420 and a non-interposer side 422.

The interposer side 420 of the integrated circuit 418 can face the interposer 302. The non-interposer side 422 can face away from the interposer 302. The interposer side 420 or the non-interposer side 422 can include active circuitry (not shown) fabricated thereto. A redistribution layer 406 can be over the interposer side 420.

The integrated circuit 418 can have a through via 424, such as through silicon via or conductive channel. The through via 424 can traverse between the interposer side 420 and the non-interposer side 422 of the integrated circuit 418. The through via 424 can be exposed from the interposer side 420 and can connect to the redistribution layer 406. The through via 424 can be exposed from the non-interposer side 422 to form interconnect pads 426.

The interposer 302 can have the interposer first side 310 and an interposer second side 428. A conductive pad 430 can be over the interposer second side 428. The interposer can have an opening 404.

The interposer 302 can have an interposer via 432, such as a conductive channel. The interposer via 432 can connect the interposer first side 310 and the interposer second side 428. The interposer via 432 can be exposed from the interposer first side 310 to form the mounting pads 308. The interposer via 432 can be exposed from the interposer second side 428 and can be connected to the conductive pad 430.

For illustrative purposes, the integrated circuit packaging system 300 is shown with the conductive pad 430 connecting two of the interposer via 432, although it is understood that the integrated circuit packaging system 300 can have a different configuration of the conductive pad 430 and interposer via 432. For example, the integrated circuit packaging system 300 can have less or more number of the interposer via 432. As a further example, the integrated circuit packaging system 300 can have the conductive pad 430 connecting to a different location of the interposer via 432.

An attachment structure 434, such as an adhesive film or adhesive paste, can connect the interposer second side 428 and the redistribution layer 406 of the integrated circuit 418.

An internal interconnect 436, such as a bond wire or ribbon bond wire, can connect the interconnect pads 426 and the conductive pad 430.

A device 412, such as a flip chip or packaged integrated circuit, can be mounted over the redistribution layer 406 with electrical connectors 438, such as solder bumps or conductive bumps. The underfill 414 can be between the device 412 and the redistribution layer 406. The underfill 414 can surround the electrical connectors 438. The device 412 can be within the opening 404 of the interposer 302.

The encapsulation 340 can be over the redistribution layer 406, the device 412, the underfill 414, the internal interconnect 436, the attachment structure 434, and can partially cover the integrated circuit 418 and interposer second side 428. For example, the encapsulation 340 can cover a portion of the integrated circuit 418 with the interconnect pads 426 connected to the internal interconnect 436. The encapsulation 340 can fill the opening 404 of the interposer 302 and can be over a portion of the interposer first side 310.

External interconnects 442, such as solder balls or conductive posts, can connect to the interconnect pads 426. The external interconnects 442 can connect to the next system level (not shown), such as a printed circuit board or another integrated circuit packaging system.

Figure 5:
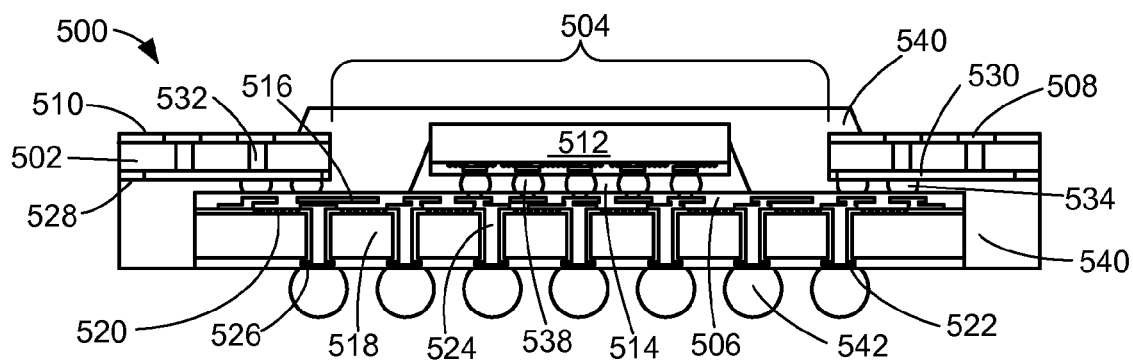
FIG. 5 is a cross-sectional view of the integrated packaging system as exemplified by the top view along line 4-4 of FIG. 3 in a third embodiment of the present invention.

Referring now to FIG. 5, therein is shown a cross-sectional view of an integrated packaging system 500 as exemplified by the top view along line 4-4 of FIG. 3 in a third embodiment of the present invention. The cross-sectional view depicts an integrated circuit 518, such as an integrated circuit die or a flip chip, having an interposer side 520 and a non-interposer side 522.

The interposer side 520 of the integrated circuit 518 can face the interposer 502. The non-interposer side 522 can face away from the interposer 502. The interposer side 520 or the non-interposer side 522 can include active circuitry (not shown) fabricated thereto. A redistribution layer 506 can be over the interposer side 520.

The non-interposer side 522 can include active circuitry (not shown) fabricated thereto.

The integrated circuit 518 can have a through via 524, such as through silicon via or conductive channel. The through via 524 can traverse between the interposer side 520 and the non-interposer side 522 of the integrated circuit 518. The through via 524 can be exposed from the interposer side 520 and can connect to the redistribution layer 506. The through via 524 can be exposed from the non-interposer side 522 to form interconnect pads 526.

The interposer 502 can have an interposer first side 510 and an interposer second side 528. The interposer can have an opening 505. A conductive pad 530 can be over the interposer second side 528. An attachment structure 534, such a solder bump or connective bump, can connect the interposer second side 528 and the redistribution layer 506 of the integrated circuit 518.

The interposer 502 can have an interposer via 532, such as a conductive channel. The interposer via 532 can connect the interposer first side 510 and the interposer second side 528. The interposer via 532 can be exposed from the interposer first side 510 to form mounting pads 508. The interposer via 532 can be exposed from the interposer second side 528 and can be connected to the conductive pad 530.

For illustrative purposes, the integrated circuit packaging system 500 is shown with the conductive pad 530 connecting two of the interposer via 532, although it is understood that the integrated circuit packaging system 500 can have a different configuration of the conductive pad 530 and interposer via 532. For example, the integrated circuit packaging system 500 can have fewer or more of the interposer via 532. As a further example, the integrated circuit packaging system 500 can have the conductive pad 530 connecting to a different location of the interposer via 532.

A device 512, such as a flip chip or packaged integrated circuit, can be mounted over the redistribution layer 506 and within the opening 504 of the interposer 502 with electrical connectors 538, such as solder bumps or conductive bumps. The underfill 514 can be between the device 512 and the redistribution layer 506. The underfill 514 can surround the electrical connectors 538. The device 512 can be within the opening 404 of the interposer 502.

The encapsulation 540 can be over the redistribution layer 506, the device 512, the underfill 514, attachment structure 534, and can partially cover the integrated circuit 518 and interposer second side 528. For example, the encapsulation 540 can cover a portion of the integrated circuit 518 with the interconnect pads 536 connected to the internal interconnect 536. The encapsulation 540 can fill the opening 404 of the interposer 502 and can be over a portion of the interposer first side 510. The encapsulation 540 can be planar with the non-interposer side 522 of the integrated circuit 518.

External interconnects 542, such as solder balls or conductive posts, can connect to the interconnect pads 526. The external interconnects 542 can connect to the next system level (not shown), such as a printed circuit board or another integrated circuit packaging system.

Figure 6:
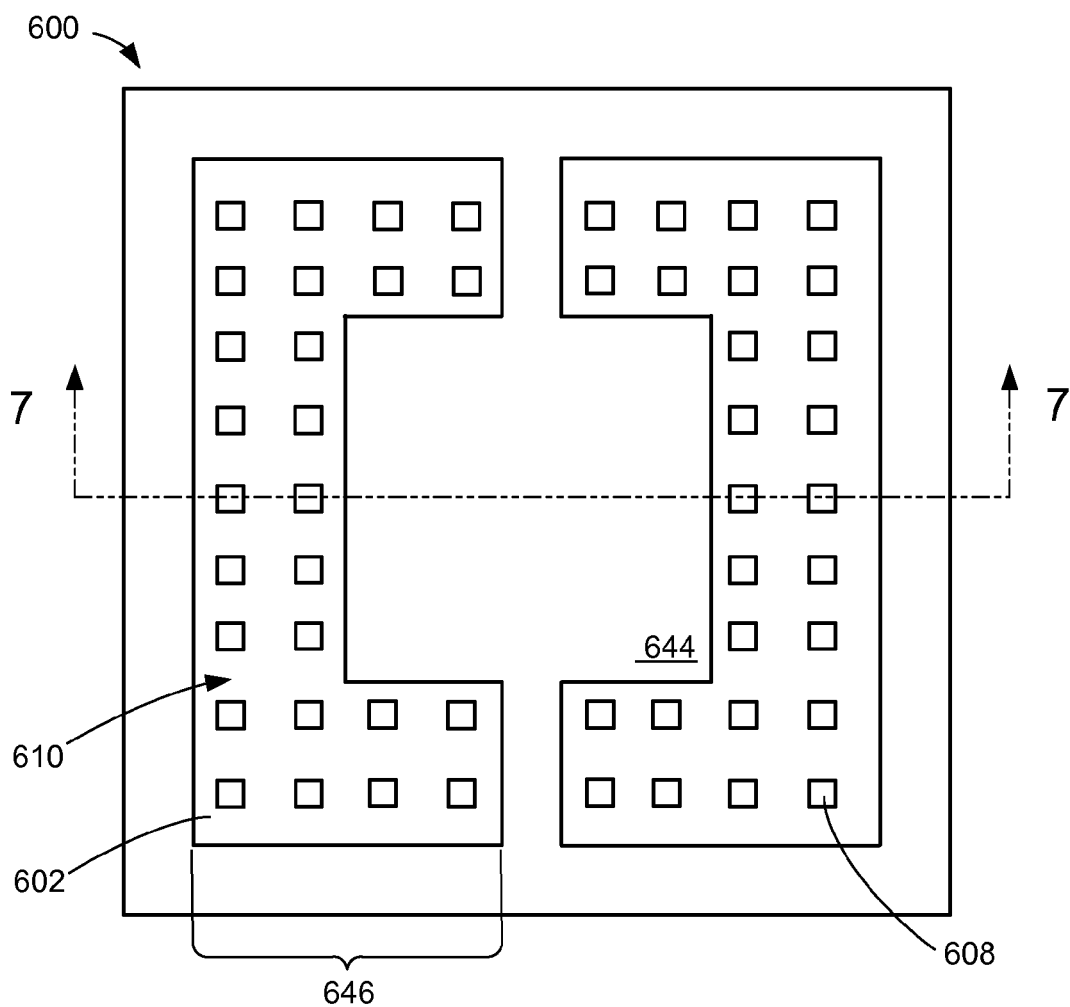
FIG. 6 is a top view of an integrated circuit packaging system in a fourth embodiment of the present invention.

Referring now to FIG. 6, therein is shown a top view of an integrated circuit packaging system 600 in a fourth embodiment of the present invention. The top view depicts a conductive structure 644, such as a heat spreader or a conformal shielding layer. The conductive structure can have slots 646. The conductive structure 644 can be over an interposer 602, such as a laminated substrate or a carrier, having mounting pads 608 exposed from an interposer first side 610. The interposer 602 having the mounting pads 608 can be exposed from slots 646 in the conductive structure 644.

Figure 7:
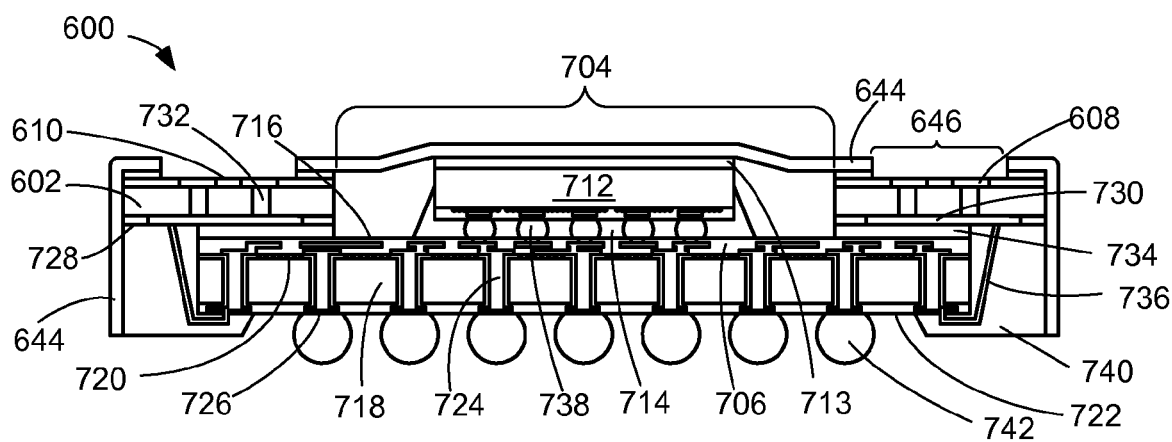
FIG. 7 is a cross-sectional view of the integrated packaging system along line 7-7 of FIG. 6.

Referring now to FIG. 7, therein is shown a cross-sectional view of the integrated packaging system 600 along line 7-7 of FIG. 6. The cross-sectional view depicts an integrated circuit 718, such as an integrated circuit die or a flip chip, having the redistribution layer 706. The integrated circuit 718 can have an interposer side 720 and a non-interposer side 722. The redistribution layer 706 can be over the interposer side 720 of the integrated circuit.

The interposer side 720 of the integrated circuit 718 can face the interposer 602. The non-interposer side 722 can face away from the interposer 602. The interposer side 720 or the non-interposer side 722 can include active circuitry (not shown) fabricated thereto.

The integrated circuit 718 can have a through via 724, such as through silicon via or conductive channel. The through via 724 can traverse between the interposer side 720 and the non-interposer side 722 of the integrated circuit 718. The through via 724 can be exposed from the interposer side 720 and can connect to the redistribution layer 706. The through via 724 can be exposed from the non-interposer side 722 to form interconnect pads 726.

The interposer 602 can have the interposer first side 610 and an interposer second side 728. A conductive pad 730 can be over the interposer second side 728. The interposer can have an opening 704.

The interposer 602 can have an interposer via 732, such as a conductive channel. The interposer via 732 can connect the interposer first side 610 and the interposer second side 728. The interposer via 732 can be exposed from the interposer first side 610 to form the mounting pads 608. The interposer via 732 can be exposed from the interposer second side 728 and can be connected to the conductive pad 730.

For illustrative purposes, the integrated circuit packaging system 600 is shown with the conductive pad 730 connecting two of the interposer via 732, although it is understood that the integrated circuit packaging system 600 can have a different configuration of the conductive pad 730 and interposer via 732 can have a different configuration. For example, the integrated circuit packaging system 600 can have fewer or more of the interposer via 732. As a further example, the integrated circuit packaging system 600 can have the conductive pad 730 connecting to a different location of the interposer via 732.

An attachment structure 734, such as an adhesive film or adhesive paste, can connect the interposer second side 728 and the redistribution layer 706 of the integrated circuit 718. An internal interconnect 736, such as a bond wire or ribbon bond wire, can connect the interconnect pads 726 and the conductive pad 730.

A device 712 can be mounted over the redistribution layer 706 and within the opening 704 of the interposer 602 with electrical connectors 738, such as solder bumps or conductive bumps. The underfill 714 can be between the device 712 and the redistribution layer 706. The underfill 714 can surround the electrical connectors 738. The device 712 can be within the opening 404 of the interposer 602.

The conductive structure 644 can be attached to the device 712 with an adhesive 713, such as a conductive adhesive or a thermal adhesive, and the interposer 602. The conductive structure 644 can be attached to the interposer 602 for grounding allowing the conductive structure 644 to function as an electromagnetic interference (EMI) shield.

An encapsulation 740, such as a cover including an epoxy molding compound, can cover the internal interconnect 736 partially covering the integrated circuit 718 and interposer second side 728. For example, the encapsulation 740 can cover a portion of the integrated circuit 718 with the interconnect pads 726 connected to the internal interconnect 736.

External interconnects 742, such as solder balls, can connect to the interconnect pads 726. The external interconnects 742 can connect to the next system level (not shown), such as a printed circuit board or another integrated circuit packaging system.

Figure 8:
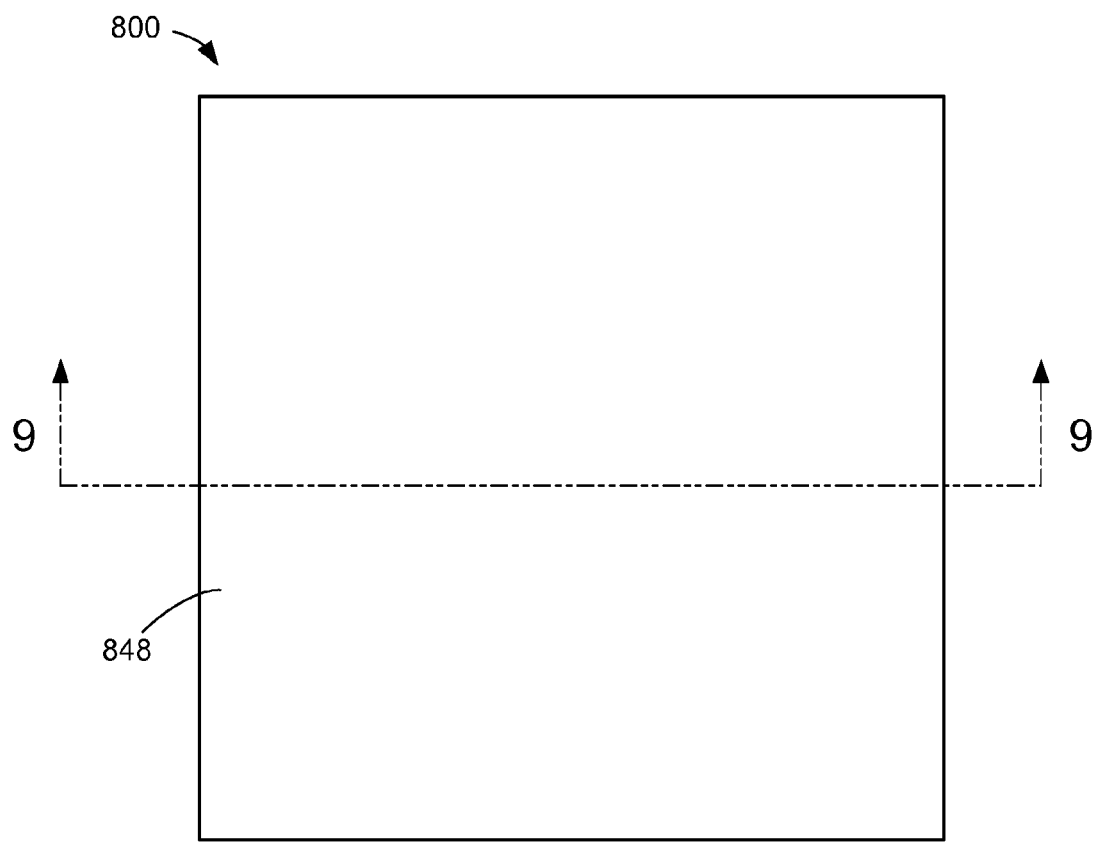
FIG. 8 is a top view of a package-on-package system in a first example application of the integrated circuit packaging system of FIG. 1 in a fifth embodiment of the present invention.

Referring now to FIG. 8, therein is shown a top view of a package-on-package system 800 in a first example application of the integrated circuit packaging system 100 of FIG. 1 in a fifth embodiment of the present invention. The top view depicts a mountable circuit 848, such as a packaged integrated circuit or an electrical component.

For illustrative purposes, the package-on-package system 900 is shown having a square geometric shape, although it is understood that the shape of the package-on-package system 900 may be different. For example, the integrated circuit package-on-package system 900 can have a rectangular shape.

Figure 9:
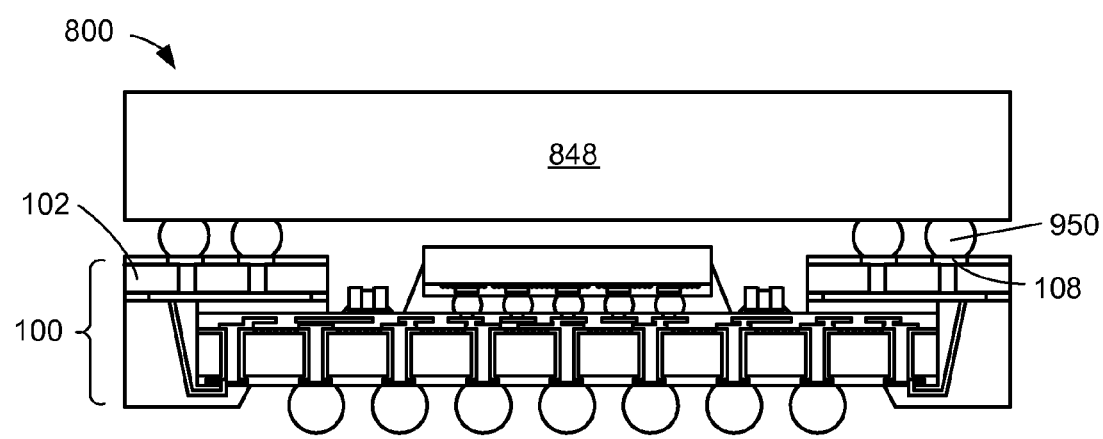
FIG. 9 is a cross-sectional view of the package-on-package system along line 10-10 of FIG. 9.

Referring now to FIG. 9, therein is shown a cross-sectional view of the package-on-package system 900 along line 10-10 of FIG. 9. The cross-sectional view depicts the mountable circuit 848 mounted over the integrated circuit packaging system 100. Mounting interconnects 950, such as a solder ball, can connect the mountable circuit 848 to the mounting pads 108 of the interposer 102.

Figure 10:
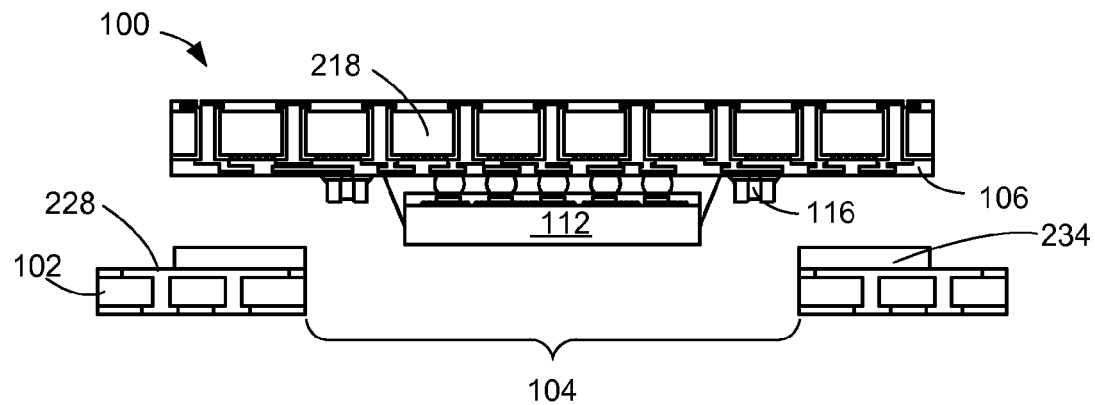
FIG. 10 is a cross-sectional view of the integrated circuit packaging system of FIG. 2 in an attaching phase of the integrated circuit.

Referring now to FIG. 10, therein is shown a cross-sectional view of the integrated circuit packaging system 100 of FIG. 2 in an attaching phase of the integrated circuit. The cross-sectional view depicts connecting the integrated circuit 218 having the redistribution layer 106 and the interposer 102 having the interposer second side 228. The integrated circuit 218 can have the device 112 and the component 116 mounted over the redistribution layer 106. The interposer 102 with the attachment structure 234 attached to the interposer second side 228 can be aligned over the integrated circuit 218 with the device 112 and the component 116 within the opening.

Figure 11:
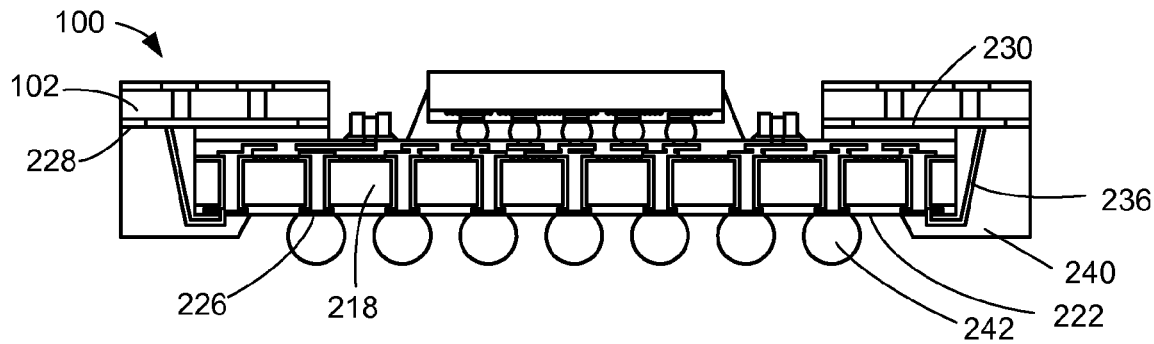
FIG. 11 is the structure of FIG. 10 in a forming phase of the encapsulation.

Referring now to FIG. 11, therein is shown the structure of FIG. 10 in a forming phase of the encapsulation 240. The internal interconnect 236 can connect the conductive pad 230 and the interconnect pads 226. The encapsulation can be over the internal interconnect 236, the interposer second side 228 and a portion of the non-interposer side 222. The external interconnects 242 can be connected to the interconnect pads 226.

Figure 12:
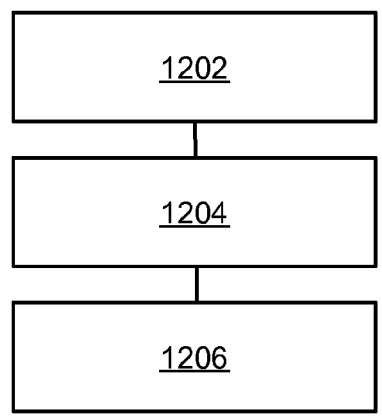
FIG. 12 is a flow chart of a method of manufacture of an integrated circuit packaging system in an embodiment of the present invention.

Referring now to FIG. 12, therein is shown a flow chart of a method 1200 of manufacture of an integrated circuit packaging system in an embodiment of the present invention. The method 1200 includes mounting a device over an integrated circuit having a through via in block 1202; attaching an interposer, having an opening, and the integrated circuit with the device within the opening in block 1204; and forming an encapsulation at least partially covering the integrated circuit and the interposer facing the integrated circuit in block 1206.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit packaging system comprising:
providing an integrated circuit having a through via and having a redistribution layer;
mounting a device directly attached to the redistribution layer of the integrated circuit;
attaching an interposer on the integrated circuit, the interposer having an opening with the device within the opening, a side of the device facing away from the redistribution layer protruding above an interposer first side; and
forming an encapsulation at least partially covering the integrated circuit.

2. The method as claimed in claim 1 further comprising:
providing the integrated circuit having an interposer side with the interposer side having active circuitry thereon; and
wherein attaching the interposer, having the opening, and the integrated circuit includes:
attaching the interposer with the interposer side facing the interposer.

3. The method as claimed in claim 1 further comprising:
providing the integrated circuit having a non-interposer side with the non-interposer side having active circuitry thereon; and
wherein attaching the interposer, having the opening, and the integrated circuit includes:
attaching the interposer with the non-interposer side facing away from the interposer.

4. The method as claimed in claim 1 further comprising mounting a component over the integrated circuit for configuring the integrated circuit and the device with the component.

5. The method as claimed in claim 1 further comprising connecting an attachment structure to the integrated circuit, the interposer, and the device.

6. A method of manufacturing an integrated circuit packaging system comprising:
providing an integrated circuit having a through via and having a redistribution layer;
mounting a device directly attached to the redistribution layer of the integrated circuit;
connecting an interposer, interposer on the integrated circuit, the interposer having an opening with the device within the opening, a side of the device facing away from the redistribution layer protruding above an interposer first side; and
connecting an attachment structure to the integrated circuit, the interposer, the device, or any combination thereof; and
forming an encapsulation at least partially covering the integrated circuit.

7. The method as claimed in claim 6 wherein forming the encapsulation includes covering the device with the encapsulation planar with the integrated circuit.

8. The method as claimed in claim 6 further comprising attaching a conductive structure, having a slot to the interposer and the device with the slot exposing the interposer.

9. The method as claimed in claim 6 further comprising stacking a mountable circuit over the interposer.

10. The method as claimed in claim 6 wherein mounting the device over the integrated circuit includes mounting a flip-chip.

11. An integrated circuit packaging system comprising:
an integrated circuit having a through via and having a redistribution layer;
a device directly attached to the redistribution layer of the integrated circuit;
an interposer, having an opening with the device, within the opening, attached to the integrated circuit with a side of the device facing away from the redistribution layer protruding above an interposer first side; and
an encapsulation at least partially covering the integrated circuit.

12. The system as claimed in claim 11 wherein the integrated circuit includes an interposer side with the interposer side having active circuitry thereon and the interposer side facing the interposer.

13. The system as claimed in claim 11 wherein the integrated circuit includes a non-interposer side with the non-interposer side having active circuitry thereon and the non-interposer side facing away from the interposer.

14. The system as claimed in claim 11 further comprising a component mounted over the integrated circuit for configuring the integrated circuit and the device with the component.

15. The system as claimed in claim 11 further comprising an attachment structure connected to the integrated circuit, the interposer, and the device.

16. The system as claimed in claim 11 further comprising:
an underfill between the device and the redistribution layer of the integrated circuit.

17. The system as claimed in claim 16 wherein the encapsulation covers the device with the encapsulation planar with the integrated circuit.

18. The system as claimed in claim 16 further comprising a conductive structure, having a slot, attached to the interposer and the device with the slot exposing the interposer.

19. The system as claimed in claim 16 further comprising a mountable circuit stacked over the interposer.

20. The system as claimed in claim 16 wherein the device over the integrated circuit includes a flip-chip.

* * * * *

UNITED STATES PATENT AND TRADEMARK OFFICE
CERTIFICATE OF CORRECTION

PATENT NO. : 8,624,370 B2  
APPLICATION NO. : 12/408670  
DATED : January 7, 2014  
INVENTOR(S) : Chi et al.

It is certified that error appears in the above-identified patent and that said Letters Patent is hereby corrected as shown below:

In the Claims:

Column 10, Claim 6, line 16, delete "interposer, interposer on" and insert therefor
--interposer on--

Signed and Sealed this
Twelfth Day of April, 2016

Michelle K. Lee
*Director of the United States Patent and Trademark Office*